(12) United States Patent
Oberle

(10) Patent No.: US 7,589,419 B2
(45) Date of Patent: Sep. 15, 2009

(54) SIDE CONNECTORS FOR RFID CHIP

(75) Inventor: Robert R. Oberle, Macungie, PA (US)

(73) Assignee: RCD Technology, Inc., Quakertown, PA (US)

( * ) Notice: Subject to any disclaimer, the term of this patent is extended or adjusted under 35 U.S.C. 154(b) by 224 days.

(21) Appl. No.: 11/832,246

(22) Filed: Aug. 1, 2007

(65) Prior Publication Data

US 2008/0029897 A1 Feb. 7, 2008

Related U.S. Application Data

(60) Provisional application No. 60/821,618, filed on Aug. 7, 2006.

(51) Int. Cl.
*H01L 23/34* (2006.01)
*H01L 23/48* (2006.01)

(52) U.S. Cl. .................. 257/728; 257/773; 257/786; 257/E23.02

(58) Field of Classification Search ............ 257/728, 257/773, 786, E23.02, E23.014; 340/572.1, 340/572.7

See application file for complete search history.

(56) References Cited

U.S. PATENT DOCUMENTS

| | | | |
|---|---|---|---|
| 4,783,697 A * | 11/1988 | Benenati et al. ............. | 257/584 |
| 6,078,259 A * | 6/2000 | Brady et al. ............. | 340/572.7 |
| 6,424,315 B1 * | 7/2002 | Glenn et al. ............. | 343/895 |
| 6,465,896 B1 * | 10/2002 | Norskov et al. ............. | 257/784 |
| 7,170,155 B2 * | 1/2007 | Heck et al. ............. | 257/684 |
| 7,312,528 B2 * | 12/2007 | Watanabe et al. ............. | 257/728 |
| 7,342,498 B2 * | 3/2008 | Baba et al. ............. | 340/572.5 |
| 2006/0043198 A1 | 3/2006 | Forster | |
| 2006/0214798 A1 * | 9/2006 | Wang ............. | 340/572.7 |
| 2008/0122630 A1 * | 5/2008 | Baba et al. ............. | 340/572.7 |

OTHER PUBLICATIONS

International Search Report for PCT/US2007/75103, dated Mar. 17, 2008, 7 pages.

* cited by examiner

*Primary Examiner*—Nitin Parekh
(74) *Attorney, Agent, or Firm*—Fliesler Meyer LLP

(57) ABSTRACT

An RFID chip can have an RFID circuit having first and second initial bond pads and conductive paths on the RFID chip connecting the first and second bond pads to the different sides of the chip. The conductive paths including a first side connector on a first side of the chip electrically connected to the first bond pad and a second side connector on a second side of the chip connected to the second bond pad. The first and second side connectors can cover at least half of the first and second side length respectively.

10 Claims, 2 Drawing Sheets

SIDE CONNECTORS FOR RFID CHIP

CLAIM OF PRIORITY

This application claims priority from the following co-pending applications, which are hereby incorporated in their entirety:

U.S. Provisional Application No. 60/821,618 entitled "SIDE CONNECTORS FOR RFID CHIP", by Robert R. Oberle, filed Aug. 7, 2006.

BACKGROUND OF INVENTION

Typically, interconnects for Integrated Circuits (IC) are formed by windows through a passivation layer on the chip to facilitate an electrical connection to the active circuitry in the chip. The passivation layer is typically a layer of nonconductive oxide or other dielectric material that serves to isolate the circuitry of the chip from the outside world. The number of windows in the passivation layer is dictated by the functionality of the chip. For a typical radio-frequency identification (RFID) chip the number of active interconnections is two. These interconnections facilitate the attachment the terminals of the antenna of the RFID circuit to the chip circuitry. A diagram of a typical chip and interconnection location of an RFID chip is given in FIG. 1. Typical RFID IC chips are 1 mm square with bond pads being 20 microns square.

In a typical RFID application, metallic bumps are formed on the interconnections, these are typically slightly larger than the interconnects in the plane of the IC and typically 10-20 microns high (out of the plane of the IC). The interconnect bumps may be formed of gold, nickel, copper, solder or other metal. The composition of the interconnect bumps and methodologies for the fabrication are known to those skilled in the art.

DETAILED DESCRIPTION

Figure 1:
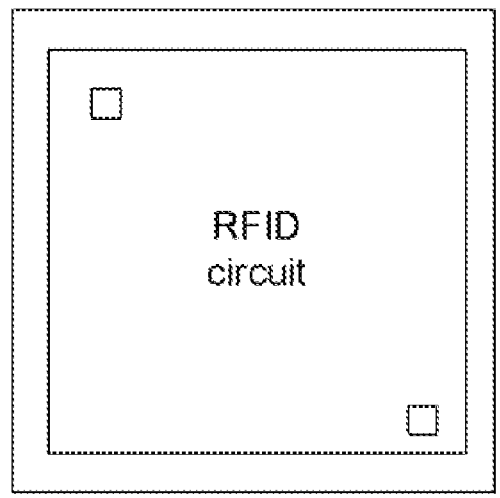
FIG. 1 is a diagram of a prior art RFID chip.
Figure 2:
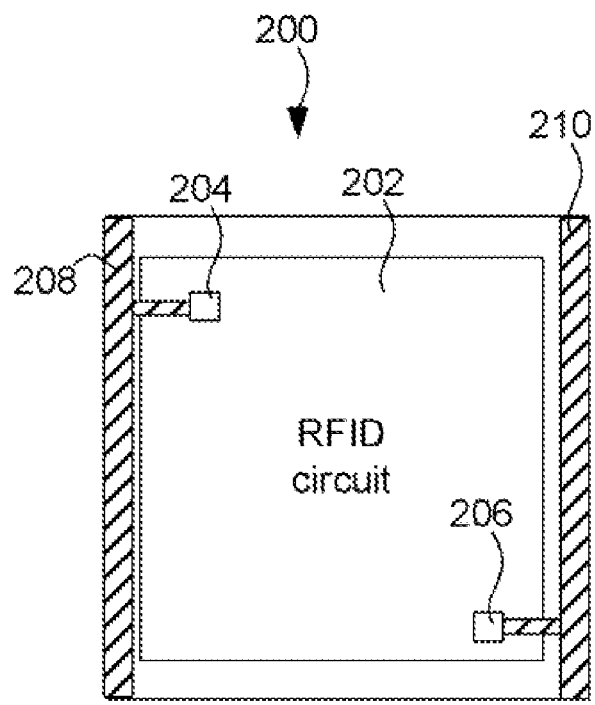
FIG. 2 is a diagram of an RFID chip with side connectors

A redistribution technique can be used to re-configure the bond pads of a RFID flip chip IC to two large bond pads at the ends of the chip, this allows the use of the developed infrastructure for mounting of passive components to be used for the attachment of RFID chips to RFID antenna or straps. Straps are sub-assemblies that allow for rapid and efficient assembly of RFID inlays for RFID or tag labels.

In one embodiment, an RFID chip comprises an RFID circuit 202 having first and second initial bond pads 204 and 206 and conductive paths on the RFID chip connecting the first and second bond pads to the different sides of the chip. The conductive paths including a first side connector 208 on a first side of the chip electrically connected to the first bond pad 204 and a second side connector 210 on a second side of the chip connected to the second bond pad 206. The first and second side connectors can cover at least half of the first and second side length respectively.

In one embodiment, the first and second side connectors can substantially cover the two opposite sides of an RFID chip.

The RFID chip 200 can include an insulative or (passivation) layer over the RFID circuit. The conductive paths can be on top of the insulative layer.

Figure 3:
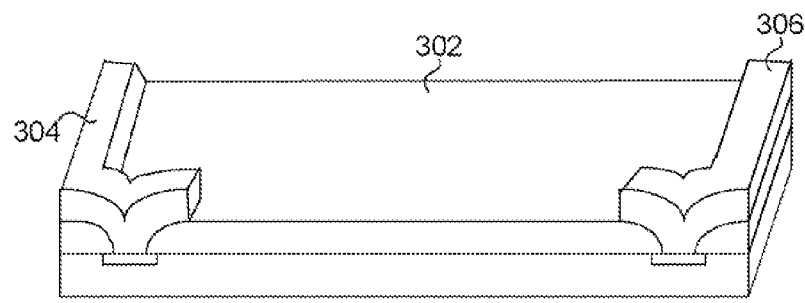
FIG. 3 is another diagram of an RFID chip with side.

FIG. 3 shows an example with passivation layer 302 and side connections 304 and 306. The passivation layer 320 is produced for traditional IC chips. The side connectors 304 and 306 and conductive paths can be produced in an additional metallization layer that replaces the interconnect bump forming step. The metallization layer can be added before the chip is separated from wafer. The metallization layer can be a traditional metallization layer formed over a resist layer that is later removed. In one embodiment, the metallization layer is about 3 microns thick.

In one embodiment, the first and second side connectors can wrap around from the top to the bottom of the RFID chip at the sides and be made of silver. This can be done after the chip is removed from the wafer.

Figure 4:
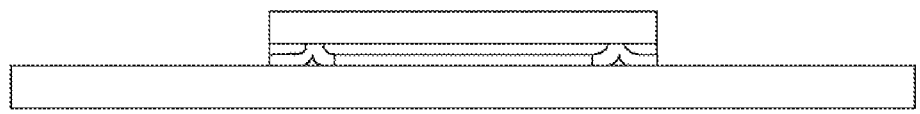
FIG. 4 is a diagram of an RFID chip with side connectors attached to an inlay.

A support unit can be electrically connected to the RFID chip such that the first and second side connectors contact the support unit. This support unit can be an inlay unit for connection to an RFID antenna as shown in FIG. 4 or can be a RFID antenna unit itself.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A Radio Frequency Identification (RFID) chip comprising:
a RFID circuit having first and second bond pads on a top surface of the RFID chip; and
conductive paths on the top surface of the RFID chip connecting the first and second bond pads along two opposite sides of the RFID chip respectively, the conductive paths including a first side connector on a first side of the two opposite sides on the top surface of the RFID chip electrically connected to the first bond pad and a second side connector on a second opposite sides on the top surface of the RFID chip connected to the second bond pad, wherein the first and the second side connectors protrude from the top surface of the RFID chip entirely covering two opposite side lengths of the respective opposite sides on the top surface the top of the RFID chip.

2. The RFID chip of claim 1, wherein the RFID chip includes an insulative layer over the RFID circuit.

3. The RFID chip of claim 2, wherein the conductive paths are on top of the insulative layer.

4. The RFID chip of claim 2, wherein the conductive paths and the connectors are formed in a metallization layer.

5. The RFID chip of claim 4, wherein chip is removed from a wafer after the metallization layer is formed.

6. A RFID unit comprising an RFID chip including:
a RFID circuit having first and second bond pads on a top surface of the RFID chip; and
conductive paths on the top surface of the RFID chip connecting the first and second bond pads along two opposite sides of the RFID chip respectively, the conductive paths including a first side connector on a first side of the two opposite sides on the top surface of the RFID chip electrically connected to the first bond pad and a second side connector on a second side of the two opposite sides on the top surface of the RFID chip connected to the second bond pad; wherein the first and second side connectors protrude from the top surface of the RFID chip entirely covering two opposite side lengths of the respective opposite sides on the top surface of the RFID chip; and a support unit electrically connected to the RFID chip such that the first and second side connectors contact the support unit.

7. The RFID unit of claim 6, wherein the RFID chip includes an insulative layer over the RFID circuit.

8. The RFID unit of claim 7, wherein the conductive paths are on top of the insulative layer.

9. The RFID unit of claim 6, wherein the conductive paths and the connectors are formed in a metallization layer.

10. The RFID unit of claim 9, wherein the chip is removed from a wafer after the metallization layer is formed.

* * * * *